(12) United States Patent
Yamakawa

(10) Patent No.: US 6,447,923 B1
(45) Date of Patent: Sep. 10, 2002

(54) METALLIZED SILICON NITRIDE CERAMIC AND FABRICATING PROCESS THEREOF AS WELL AS METALLIZING COMPOSITE FOR THE PROCESS

(75) Inventor: Akira Yamakawa, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/143,611

(22) Filed: Aug. 28, 1998

(30) Foreign Application Priority Data

Sep. 3, 1997 (JP) .............................. 9-238167

(51) Int. Cl.$^7$ .............................. B32B 15/04
(52) U.S. Cl. ................ 428/450; 428/469; 428/698; 428/697; 427/372.2; 427/383.1; 427/383.5
(58) Field of Search ................ 428/698, 472, 428/450, 697; 106/1.05, 1.25, 1.26; 252/512, 514, 515, 518.1; 427/372.2, 383.1, 383.5

(56) References Cited

U.S. PATENT DOCUMENTS

| | | | |
|---|---|---|---|
| 4,093,687 A | * 6/1978 | Gresovich et al. | 264/65 |
| 4,113,830 A | * 9/1978 | Mazdiyasni et al. | 264/101 |
| 4,510,107 A | * 4/1985 | Ezis et al. | 264/65 |
| 4,552,711 A | * 11/1985 | Raj | 264/65 |
| 4,685,607 A | 8/1987 | Takeda et al. | 228/193 |
| 4,769,690 A | * 9/1988 | Suzuki et al. | 357/67 |
| 5,294,750 A | 3/1994 | Sakai et al. | 174/52.4 |
| 5,308,561 A | * 5/1994 | Leimer et al. | 264/65 |
| 5,587,111 A | * 12/1996 | Watanabe et al. | 252/514 |
| 5,733,498 A | * 3/1998 | Kawakami et al. | 264/645 |
| 5,928,601 A | * 7/1999 | Miyake et al. | 264/659 |
| 5,998,000 A | * 12/1999 | Ikeda et al. | 428/210 |
| 6,057,644 A | * 5/2000 | Niimi et al. | 313/623 |

FOREIGN PATENT DOCUMENTS

| | | |
|---|---|---|
| EP | 0 766 307 A1 | 4/1997 |
| JP | 06183864 | 7/1994 |
| JP | 07149588 | 6/1995 |

OTHER PUBLICATIONS

Database WPI, Section Ch, Week 8321, Derwent Publications Ltd., London, GB; AN 83–49743K. (Abstract Only) No Date.
Database WPI, Section Ch, Week 8726, Derwent Publications Ltd., London, GB; AN 87–182711 No Date.

* cited by examiner

Primary Examiner—Deborah Jones
Assistant Examiner—Stephen Stein
(74) Attorney, Agent, or Firm—McDermott, Will & Emery

(57) ABSTRACT

A highly reliable metallized $Si_3N_4$ ceramic having a metallizing layer of high bonding strength on the surface of a highly heat-conductive, mechanically-strong $Si_3N_4$ ceramic. A metallizing layer including 0.01 to 20% silicon by weight in terms of silicon is formed on the surface of a silicon nitride ceramic including 0.01 to 10% free silicon by weight and having a thermal conductivity of 50 W/mK or more and a bending strength of 600 MPa or more. The silicon component in the metallizing layer is either introduced from the silicon nitride ceramic by diffusion or included in a metallizing paste beforehand.

12 Claims, No Drawings

METALLIZED SILICON NITRIDE CERAMIC AND FABRICATING PROCESS THEREOF AS WELL AS METALLIZING COMPOSITE FOR THE PROCESS

BACKGROUND OF THE INVENTION

1. Field of the Invention

The present invention relates to a metallized silicon nitride ceramic having a metallizing layer of high bonding strength on the surface of a highly heat-conductive, mechanically-strong silicon nitride ceramic; to a fabricating process thereof; and to a metallizing composite for the process. In the invention, the term "silicon nitride ceramic (s)" as well as the term "$Si_3N_4$ ceramic(s)" includes $Si_3N_4$-based ceramic(s), $Si_3N_4$-glass-based ceramic(s), and $Si_{6-x}Al_xO_xN_{4-x}$ (Sialon)-based ceramic(s).

2. Description of the Background Art

Highly heat-conductive materials also superior in electrical insulation, mechanical strength, and antiwear quality are needed as a sliding part in mechanical equipment or as a circuit substrate in electronic devices. Ceramics are used in these fields as a material that meets the requirements.

An alumina, one of the ceramic materials, is usually used in these fields. Although superior in electrical insulation and antiwear quality, the alumina has low thermal conductivity and hence is not suited for use in electronic devices or in a sliding part of mechanical equipment where heat must be rapidly dissipated to prevent excessive temperature increase.

Recently, an aluminum nitride having a high thermal conductivity, therefore having high capability in heat dissipation, is increasingly used. But the aluminum nitride has poor antiwear quality and mechanical strength, hence has low reliability as a structural member. In response to this problem, $Si_3N_4$ ceramics having a high mechanical strength and high thermal conductivity are being developed. And there is a high possibility to solve the problem as a ceramic package comprising a $Si_3N_4$-based ceramic with a bending strength of 30 kg/mm$^2$ or more as disclosed in the unexamined published Japanese patent application Tokukaihei 4-125950.

When a highly heat-conductive $Si_3N_4$ ceramic is used as a semiconductor package or circuit substrate or is brazed to a metal part as a structural member of a machine, the surface of the ceramic must be metallized. For example, the unexamined published Japanese patent application Tokukaihei 9-69672 discloses several methods of surface metallization for $Si_3N_4$-based ceramics, such as a directly-uniting method of a highly heat-conductive $Si_3N_4$-based ceramic substrate with a sheet of copper circuit, an active-metal method to unite an $Si_3N_4$-based ceramic substrate with a sheet of metal circuit, and a method to metallize the surface of an $Si_3N_4$-based ceramic substrate by a high-melting-point metallization method.

However, the above-mentioned methods are incapable of forming a highly reliable, strongly-bonded metallizing layer on the surface of an $Si_3N_4$-based ceramic. Furthermore, the directly-uniting method of an $Si_3N_4$-based ceramic substrate with a sheet of copper circuit and the active-metal method disclosed in the Tokukaihei 9-69672 are limited in the application of the metallized $Si_3N_4$-based ceramics.

The high-melting-point metallization method disclosed in the Tokukaihei 9-69672, which bakes a metallizing composite consisting mainly of a high-melting-point metal and titanium or its alloys onto the surface of an $Si_3N_4$-based ceramic, gives a relatively weak bonding between the $Si_3N_4$-based ceramic and the metallizing layer. Therefore, products fabricated by this method are unreliable for adequate use in heavy-duty bonded parts, though this method provides adequate bonding strength for a copper circuit substrate such as disclosed in the Tokukaihei 9-69672.

SUMMARY OF THE INVENTION

To overcome the above-mentioned difficulties, the present invention provides a highly reliable metallized $Si_3N_4$ ceramic having a metallizing layer of high bonding strength on the surface of a highly heat-conductive, mechanically-strong $Si_3N_4$ ceramic; a fabricating process thereof; and a metallizing composite for the process.

For the above purpose, the metallized silicon nitride ceramic of the invention specifically has a metallizing layer, which contains 0.01 to 20% silicon by weight in terms of silicon, formed on the entire or a part of the surface of a silicon nitride ceramic having 0.01 to 10% free silicon by weight.

In the metallized silicon nitride ceramic of the invention, it is preferable that the silicon nitride ceramic have a thermal conductivity of 50 W/mK or more and a bending strength of 600 MPa or more, and that the metallizing layer contain 0.01 to 5% silicon by weight in terms of silicon, and that the contained silicon be free silicon.

A fabricating process for the metallized silicon nitride ceramic of the invention specifically comprises that first, silicon powders having an average particle size of 5 μm or less and powders of rare earth compounds are mixed to form a compact; second, the compact is heated in a non-oxidizing atmosphere including nitrogen to produce a silicon nitride ceramic having 0.01 to 10% unnitrided, or free, silicon by weight; and third, a metallizing paste is applied on the entire or a part of the surface of the silicon nitride ceramic to be baked in a non-oxidizing atmosphere so that a metallizing layer containing 0.01 to 20% silicon by weight in terms of silicon is formed.

The other fabricating process for the metallized silicon nitride ceramic of the invention specifically comprises that first, silicon powders having an average particle size of 5 μm or less and powders of rare earth compounds are mixed to form a compact; second, a metallizing paste is applied on the entire or a part of the surface of the compact; and third, the compact is sintered with heat in a non-oxidizing atmosphere including nitrogen to produce a silicon nitride ceramic having 0.01 to 10% unnitrided, or free, silicon by weight and to form at the same time a metallizing layer containing 0.01 to 20% silicon by weight in terms of silicon on the surface of the ceramic.

In either of the above-mentioned processes, the metallizing paste comprises a metallizing composite and a vehicle, which includes a binder resin and a solvent. In the invention, the metallizing composite has a metal component as its main ingredient and may include 0.01 to 20% silicon by weight in terms of silicon.

According to the present invention, a highly reliable metallized $Si_3N_4$ ceramic may be produced, which comprises a highly heat-conductive, high strength bending and wear-resistant $Si_3N_4$ ceramic having a strongly bonded metallizing layer thereon.

The metallized $SiN_{3N4}$ ceramic of the invention is useful as a ceramic circuit substrate for transistors, a ceramic package, and other parts of semiconductor devices or as a machine's structural member in combination with a metal part. The ceramic may serve additionally to improve the performance of these devices and machines.

DETAILED DESCRIPTION OF THE INVENTION

Efforts were made to seek a means for improving the bonding strength between an $Si_3N_4$ ceramic and a metallizing layer. Finally it was found that high bonding strength is attainable by combining an $Si_3N_4$ ceramic having free silicon with a metallizing layer having free silicon and other silicon-containing components. The end result was a highly heat-conductive metallized $Si_3N_4$ ceramic with exceptionally high mechanical strength.

In the invention, it is imperative that an $Si_3N_4$ ceramic to be metallized contains 0.01 to 10% free silicon by weight. The free silicon in the $Si_3N_4$ ceramic plays an important role in improving the bonding strength between the ceramic and the metallizing layer having silicon components. If the content is less than 0.01% by weight, the bonding between the ceramic and the metallizing layer is weakened; if more than 10% by weight, the mechanical strength and heat-resisting property of the $Si_3N_4$ ceramic itself decreases.

It is desirable that the $Si_3N_4$ ceramic have a thermal conductivity of 50 W/mK or more and a bending strength of 600 MPa or more. To obtain sufficient heat-dissipating power as a circuit substrate, a ceramic package, and other electronic parts or as a sliding part in machines, it is desirable that the ceramic have a thermal conductivity of 50 W/mK or more, preferably 100 W/mK or more. To obtain sufficient mechanical strength as a reliable structural member of machines, it is desirable that the ceramic have a bending strength of 600 MPa or more.

It is also imperative that the metallizing layer on an $Si_3N_4$ ceramic not only have a metal component as its main ingredient but also contain 0.01 to 20% silicon by weight in terms of silicon, preferably 0.01 to 5% by weight. If the content is less than 0.01% by weight, the bonding between the ceramic and the metallizing layer is weakened; if more than 20% by weight, the mechanical strength and heat-resisting property of the metallizing layer itself decreases.

The silicon component included in the metallizing layer may comprise a compound such as $Si_3N_4$, SiC, or a silicide as well as free silicon. Free silicon is especially preferable because it exhibits superior effects on such properties as bonding strength. The silicon component may be added directly into a metallizing paste or metallizing composite, or the free silicon included in the $Si_3N_4$ ceramic may be introduced into the metallizing layer by diffusion when the metallizing layer is formed.

To fabricate the metallized $Si_3N_4$ ceramic of the invention, an Si3N4 ceramic, superior in many aspects as described above, having 0.01 to 10% free silicon by weight is first produced, and a metallizing paste is applied on the surface of the ceramic to be baked so that a metallizing layer is formed. As mentioned above, the required amount of free silicon may be introduced into the metallizing layer by diffusion from the $Si_3N_4$ ceramic or a predetermined amount of silicon component may be mixed with the metallizing paste beforehand.

However, it is usually time-consuming and costly to produce a highly heat-conductive $Si_3N_4$ ceramic which has simultaneously the required amount of free silicon. Hence, it is desirable that the fabricating process of the invention be applied as described below, which employs a reaction-sintering method.

The first fabricating process of the invention comprises that first, silicon powders having an average particle size of 5 μm or less and powders of rare earth compounds are mixed to form a compact; second, the compact is heated in a non-oxidizing atmosphere including nitrogen to produce an $Si_3N_4$ ceramic having 0.01 to 10% unnitrided, or free, silicon by weight; and third, a metallizing paste is applied on the surface of the $Si_3N_4$ ceramic to be baked in a non-oxidizing atmosphere so that a metallizing layer is formed.

If the average particle size of the silicon powders used as the material exceeds 5 μm, the nitriding reaction of the silicon is inhibited and a superior $Si_3N_4$ ceramic cannot be obtained. Of course, material silicon powders having an average particle size of more than 5 μm can be crushed to reduce the particle size to 5 μm or below before the compaction. Powders of rare earth compounds are added to facilitate the nitriding reaction and densifying process of the silicon, a preferred amount of addition being 1 to 15% by weight of the silicon powders. The rare earth compounds may be selected from the group including individual oxides of Ce, Sm, and La as well as from $Y_2O_3$. Compounds that transform to the rare earth compounds by heating may also be used.

The mixed body of powders of silicon and powders of rare earth compounds is compacted by a conventional method, and heated in a non-oxidizing atmosphere including nitrogen for nitriding and sintering. The suitable range of the heating temperature depends on the particle size and purity of the silicon. Generally, the desirable temperature lies between 1300 and 2000° C. because the nitriding proceeds too slowly below 1300° C. According to the first fabricating process of the invention, on the surface of the $Si_3N_4$ ceramic thus provided, a metallizing paste is applied with a designed contour to be baked in a non-oxidizing atmosphere so that a metallizing layer is formed.

The second fabricating process of the invention comprises that first, silicon powders having an average particle size of 5 μm or less and powders of rare earth compounds are mixed to form a compact; second, a metallizing paste is applied on the entire or a part of the surface of the compact; and third, the compact is nitrided and sintered in a non-oxidizing atmosphere Including nitrogen to produce a silicon nitride ceramic having 0.01 to 10% unnitrided, or free, silicon by weight and to form at the same time a metallizing layer on the surface of the ceramic. In the second fabricating process, the material powders used and other conditions such as nitriding and sintering conditions are the same as those in the first fabricating process except that the metallizing layer is formed at the same time when the compact is nitrided and sintered.

In both the first and second fabricating processes, it is essential that the unnitrided, or free, silicon of 0.01 to 10% by weight remain in the completed $Si_3N_4$ ceramic and that silicon of 0.01 to 20% by weight be included in the metallizing layer. Hence, it is important to control the heating temperature and time during the reaction-sintering and baking.

As for the control of the amount of free silicon in the $Si_3N_4$ ceramic, it is preferable that first, the temperature for nitriding and sintering be kept between 1300 and 1400° C. for a relatively long time so that the free silicon of 0.01 to 10% by weight remains unnitrided, and second, the temperature is raised to and kept at 2000° C. or lower for a short time so that the sintering proceeds further to densify the ceramic. Especially in the second fabricating process, care must be taken so that the excessive diffusion of free silicon from the $Si_3N_4$ ceramic to the metallizing layer does not occur because the metallizing layer is formed at the same time when the heating for nitriding and sintering is carried out for the ceramic.

The free silicon of 0.01 to 20% by weight in the metallizing layer may either be introduced by diffusion from the $Si_3N_4$ ceramic or be included in the metallizing paste beforehand by adding a predetermined amount, roughly 0.01 to 20% by weight, of silicon or silicon-containing substances such as silicon compounds that transform into silicon by heating.

More specifically, since free silicon Is contained in the $Si_3N_4$ ceramic, the free silicon may be diffused into the metallizing layer when heating is carried out for nitriding and sintering or baking so that the content of free silicon in the metallizing layer exceeds 0.01% by weight. This means that an ordinary metallizing paste comprising a metal component as the main ingredient and a vehicle may be used. In this case, the heating temperature and time must be controlled to satisfy the above-mentioned condition of silicon content in the metallizing layer.

The other method is to use the metallizing composite of the invention, which comprises a metal component as the main ingredient and a silicon component of 0.01 to 20% by weight in terms of silicon. The composite is included in a metallizing paste together with a vehicle. Since the necessary amount of silicon is already included in the metallizing layer, the heating temperature and time must be controlled so that the silicon content in the metallizing layer does not exceed 20% by weight through the diffusion of silicon from the ceramic.

The metallizing composite of the invention mainly comprises at least one metal selected from the group consisting of gold, silver, copper, tungsten, and molybdenum. The selection for the most suitable metal or metals is based on the necessity and required reliability of brazing, the required electric properties, and other specific conditions. Gold, silver, and copper can be used for a relatively low-temperature metallization, and a high-melting-point metal such as tungsten and molybdenum is used for a high-temperature metallization. An active metal such as titanium may also be added to tungsten or molybdenum.

The metallized $Si_3N_4$ ceramic of the invention enables a highly reliable bonding with various metals or ceramic parts through the metallizing layer on the surface thereof. The ceramic is particularly useful as a ceramic circuit substrate, a ceramic package, and other parts of semiconductor devices or as a structural member brazed with a metal part in various machines. In applications such as a ceramic circuit substrate, a bonding strength of 20 to 30 MPa is required between the ceramic substrate and the metallizing layer that forms a part of an electric circuit, preferably 60 MPa or more to secure reliability In actual use. Such a requirement is fulfilled by the metallized $Si_3N_4$ ceramic of the invention.

EXAMPLE 1

Silicon powders, whose average particle size was 2 μm, were mixed with $Y_2O_3$ powders, whose amount constituted 6% of the total weight, to form a disk compact 20 mm across and 5 mm thick. The compacts having silicon as the main ingredient were first nitrided and then sintered for densification under various conditions as shown in Table 1. On the surfaces of the $Si_3N_4$ sintered bodies thus produced, metallizing pastes having various metallizing composites as shown in Table 1 with vehicles were screen-printed in a form of 2 mm square to form a metallizing layer by baking under the conditions shown in Table 1.

TABLE 1

| Sample | Nitriding Conditions (° C. × hr) | Sintering Conditions (° C. × hr) | Metallizing Composite | Baking Conditions (° C. × hr) |
|---|---|---|---|---|
| 1* | 1400 × 50 | 1800 × 1 | W + 10 wt % $Y_2O_3$ | 1650 × 1 |
| 2 | 1400 × 25 | 1800 × 1 | W + 10 wt % $Y_2O_3$ | 1650 × 1 |
| 3 | 1400 × 20 | 1800 × 1 | W + 10 wt % $Y_2O_3$ | 1650 × 1 |
| 4 | 1400 × 10 | 1800 × 1 | W + 10 wt % $Y_2O_3$ | 1650 × 1 |
| 5 | 1400 × 6 | 1800 × 1 | W + 10 wt % $Y_2O_3$ | 1650 × 1 |
| 6* | 1400 × 3 | 1800 × 1 | W + 10 wt % $Y_2O_3$ | 1650 × 1 |
| 7 | 1400 × 10 | 1800 × 1 | W + 10 wt % $Y_2O_3$ + 10 wt % Si | 1650 × 1 |
| 8* | 1400 × 10 | 1800 × 1 | W + 10 wt % $Y_2O_3$ + 25 wt % Si | 1650 × 1 |
| 9 | 1400 × 10 | 1800 × 1 | W + 10 wt % $Y_2O_3$ + 5 wt % Si | 1650 × 1 |
| 10 | 1400 × 10 | 1800 × 1 | W + 10 wt % $Y_2O_3$ + 2 wt % Si | 1650 × 1 |
| 11 | 1400 × 10 | 1800 × 1 | Au + Glass Component | 800 × 0.5 |
| 12 | 1400 × 10 | 1800 × 1 | Cu + Glass Component | 950 × 0.5 |
| 13 | 1400 × 10 | 1800 × 1 | W + 10 wt % $Y_2O_3$ + 3 wt % SiC | 1650 × 1 |

*Reference sample for comparison.

The amounts of free silicon included in the $Si_3N_4$ sintered body and in the metallizing layer on the surface thereof and various properties were measured on the individual metallized $Si_3N_4$ ceramics thus fabricated. The results are summarized in Table 2. The bonding strength of the metallizing layer was measured in such a manner that a pin 1.5 mm in diameter was first soldered onto the metallizing layer at a right angle and then the pin was pulled axially to break the metallizing layer; the breaking strength represents the bonding strength. The term "amount of free silicon" in the metallizing layer Table 2 represents the total amount of silicon including the silicon contained in the silicon compounds.

TABLE 2

| | $Si_3N_4$ Sintered Body | | | Metallizing Layer | |
|---|---|---|---|---|---|
| Sample | Amount of Free Silicon (wt %) | Thermal Conductivity (W/mK) | Bending Strength (MPa) | Amount of Free Silicon (wt %) | Bonding Strength (Mpa) |
| 1* | <0.01 | 110 | 500 | <0.01 | 15 |
| 2 | 0.05 | 100 | 800 | 0.02 | 35 |
| 3 | 0.1 | 150 | 700 | 0.03 | >60 |
| 4 | 1.0 | 120 | 1000 | 0.1 | >60 |
| 5 | 5.0 | 80 | 700 | 0.5 | >60 |
| 6* | 12.0 | 40 | 600 | 2.0 | 10 |
| 7 | 1.0 | 120 | 1000 | 10 | 60 |
| 8* | 1.0 | 120 | 1000 | 25 | 20 |
| 9 | 1.0 | 120 | 1000 | 5 | >60 |
| 10 | 1.0 | 120 | 1000 | 2 | >60 |
| 11 | 1.0 | 120 | 1000 | 0.05 | 45 |
| 12 | 1.0 | 120 | 1000 | 0.05 | 50 |
| 13 | 1.0 | 120 | 1000 | 2 | 40 |

*Reference sample for comparison.

As can be seen in Tables 1 and 2, with individual samples of the invention, metallized $Si_3N_4$ ceramics having a superior bonding strength of the metallizing layer were fabricated by a process in which the metallizing layer was formed on the surface of the previously produced $Si_3N_4$ sintered body superior in bending strength and thermal conductivity.

However, Sample 1 showed a very low bonding strength of the metallizing layer because in this sample a prolonged nitriding time caused the amount of free silicon in the sintered body to decrease, resulting in the decrease in the amount of free silicon which diffused into the metallizing layer. Conversely, an inadequate nitriding time in Sample 6 caused the amount of free silicon in the sintered body to increase, resulting in the excessive decrease in the thermal conductivity thereof and in the bonding strength of the metallizing layer. Sample 8, too, showed a low bonding strength of the metallizing layer because in this sample excessive free silicon preincluded in the metallizing layer caused the decrease in the strength of the layer.

EXAMPLE 2

Silicon powders, whose average particle size was 2 μm, were mixed with $Y_2O_3$ powders, whose amount constituted 4% of the total weight, to form a compact 20 mm wide, 40 mm long, and 5 mm thick. On the surfaces of the compacts having silicon as the main ingredient, metallizing pastes having various metallizing composites as shown in Table 3 with vehicles were screen-printed in a form of 2 mm square. Next, the compacts were nitrided and then sintered for densification under various conditions as shown in Table 3, with the metallizing layers being formed at the same time. Various properties were measured on the individual metallized $Si_3N_4$ ceramics thus fabricated. The results were summarized in Table 4.

TABLE 3

| Sample | Nitriding Conditions (° C. × hr) | Sintering Conditions (° C. × hr) | Metallizing Composite |
|---|---|---|---|
| 14 | 1400 × 50 | 1700 × 1 | W + 10 wt % $Y_2O_3$ |
| 15 | 1400 × 20 | 1700 × 1 | W + 10 wt % $Y_2O_3$ |
| 16 | 1400 × 10 | 1700 × 1 | W + 10 wt % $Y_2O_3$ |
| 17* | 1400 × 1 | 1700 × 1 | W + 10 wt % $Y_2O_3$ |
| 18 | 1400 × 20 | 1700 × 1 | W + 10 wt % $Y_2O_3$ + 10 wt % Si |

*Reference sample for comparison.

TABLE 4

| | $Si_3N_4$ Sintered Body | | | Metallizing Layer | |
|---|---|---|---|---|---|
| Sample | Amount of Free Silicon (wt %) | Thermal Conductivity (W/mK) | Bending Strength (Mpa) | Amount of Free Silicon (wt %) | Bonding Strength (Mpa) |
| 14 | 0.05 | 80 | 600 | 0.03 | 45 |
| 15 | 0.1 | 70 | 800 | 0.05 | 55 |
| 16 | 2.0 | 65 | 700 | 0.2 | >60 |
| 17* | 15 | 35 | 300 | 1.5 | 20 |
| 18 | 0.2 | 70 | 650 | 8.0 | 60 |

*Reference sample for comparison.

In example 2, metallized ceramics were fabricated by a method in which the metallizing layer was baked at the same time when the compact was nitrided and sintered. With individual samples of the invention, metallized $Si_3N_4$ ceramics having a superior bending strength and thermal conductivity as well as a high bonding strength of the metallizing layer were also fabricated by this method. However, in Sample 17 an inadequate nitriding time caused the amount of free silicon in the sintered body to increase, resulting in the decrease in the thermal conductivity thereof and in the bonding strength of the metallizing layer.

What is claimed is:

1. A metallized silicon nitride ceramic comprising;
   a silicon nitride ceramic having 0.01 to 10% free silicon by weight;
   a metallizing layer containing 0.01 to 20% silicon by weight in terms of silicon; and
   the metallized layer is formed on the entire or a part of the surface of the silicon nitride ceramic.

2. The metallized silicon nitride ceramic as defined in claim 1, wherein the silicon nitride ceramic has a thermal conductivity of 50 W/mK or more and a bending strength of 600 MPa or more.

3. The metallized silicon nitride ceramic as defined in claim 1, wherein the metallizing layer contains 0.01 to 5% silicon by weight in terms of silicon.

4. The metallized silicon nitride ceramic as defined in claim 1, wherein the silicon contained in the metallizing layer is free silicon.

5. A fabricating process for a metallized silicon nitride ceramic which comprises;
   mixing silicon powders having an average particle size of 5 μm or less and powders of rare earth compounds to form a compact;
   heating the compact in a non-oxidizing atmosphere including nitrogen to produce a silicon nitride ceramic having 0.01 to 10% unnitrided, or free, silicon by weight; and
   applying a metallizing paste on the entire or a part of the surface of the silicon nitride ceramic to be baked in a non-oxidizing atmosphere so that a metallizing layer containing 0.01 to 20% silicon by weight in terms of silicon is formed.

6. A fabricating process for a metallized silicon nitride ceramic which comprises;
   mixing silicon powders having an average particle size of 5 μm or less and powders of rare earth compounds to form a compact;
   applying a metallizing paste on the entire or a part of the surface of the compact; and
   sintering the compact in a non-oxidizing atmosphere including nitrogen to produce a silicon nitride ceramic having 0.01 to 10% unnitrided, or free, silicon by weight and to form at the same time a metallizing layer containing 0.01 to 20% silicon by weight in, terms of silicon on the surface of the silicon nitride ceramic.

7. A composite comprising a silicon nitride ceramic substrate having a metal layer thereon, said metal layer comprising 0.01 to 20 wt % silicon and as the main ingredient, a metal selected from the group consisting of silver, copper, tungsten and molybdenum.

8. The metallizing composite according to claim 7, wherein the metal component is tungsten or molybdenum.

9. The metallizing composite according to claim 8, wherein the composite further includes titanium.

10. The metallizing composite according to claim 7, wherein the metal component is tungsten.

11. The metallizing composite according to claim 10, wherein the composite further includes $Y_2O_3$.

12. The metallizing composite as defined in claim 7, wherein the included silicon is free silicon.

* * * * *